(12) United States Patent
Wu

(10) Patent No.: US 8,939,304 B2
(45) Date of Patent: Jan. 27, 2015

(54) DEVICE HOUSING AND APPARATUS FOR MAKING THE DEVICE HOUSING

(75) Inventor: Lun-Zi Wu, Shenzhen (CN)

(73) Assignee: ScienBiziP Consulting (Shenzhen) Co., Ltd., Guangdong (CN)

( * ) Notice: Subject to any disclaimer, the term of this patent is extended or adjusted under 35 U.S.C. 154(b) by 146 days.

(21) Appl. No.: 13/596,264

(22) Filed: Aug. 28, 2012

(65) Prior Publication Data

US 2013/0105500 A1    May 2, 2013

(30) Foreign Application Priority Data

Nov. 1, 2011  (CN) .......................... 2011 1 0339802

(51) Int. Cl.
*H04M 1/02*  (2006.01)
*H05K 5/00*  (2006.01)

(52) U.S. Cl.
CPC ............... *H04M 1/0202* (2013.01); *H05K 5/00* (2013.01)
USPC ....................................................... 220/3.92

(58) Field of Classification Search
CPC ........ H02G 3/105; H02G 3/083; H02G 3/081
USPC ................ 220/3.92, 3.94, 4.02, DIG. 25, 213
See application file for complete search history.

(56) References Cited

U.S. PATENT DOCUMENTS

| | | | | |
|---|---|---|---|---|
| 2,457,023 | A * | 12/1948 | Zelt | 174/50 |
| 4,151,926 | A * | 5/1979 | Kinney et al. | 220/3.94 |
| 4,560,079 | A * | 12/1985 | Eddleston et al. | 220/4.02 |
| 5,944,210 | A * | 8/1999 | Yetter | 220/4.21 |
| 6,563,046 | B1 * | 5/2003 | Jarry et al. | 174/50 |

* cited by examiner

*Primary Examiner* — Steven A. Reynolds
*Assistant Examiner* — King M Chu
(74) *Attorney, Agent, or Firm* — Novak Druce Connolly Bove + Quigg LLP

(57) ABSTRACT

A device housing includes a main body, a metallic layer, and a paint layer. The main body defines a first surface and a second surface adjacent to each other. The metallic layer is formed on the first surface, and the paint layer is formed on the second surface. The device housing further defines a groove between the first surface and the second surface to separate the metallic layer and the paint layer. An apparatus for making the device housing is also described.

6 Claims, 8 Drawing Sheets

DEVICE HOUSING AND APPARATUS FOR MAKING THE DEVICE HOUSING

BACKGROUND

1. Technical Field

The present disclosure relates to device housing and apparatus for making the device housing.

2. Description of Related Art

Housings of electronic device may be decorated by forming different decorative layers at different regions of a surface of the housing. The different decorative layers may be a metallic layer having a high gloss formed by vacuum deposition and a paint layer having a matte appearance formed by spray painting. During the formation of the metallic layer or the paint layer, shielding of the surface of the housing, the metallic layer, or the paint layer is necessary. The known shielding method may be to use a printed ink layer or a plastic film. However, it is difficult for the ink layer or the plastic film to implement a precise shielding.

Therefore, there is room for improvement within the art.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
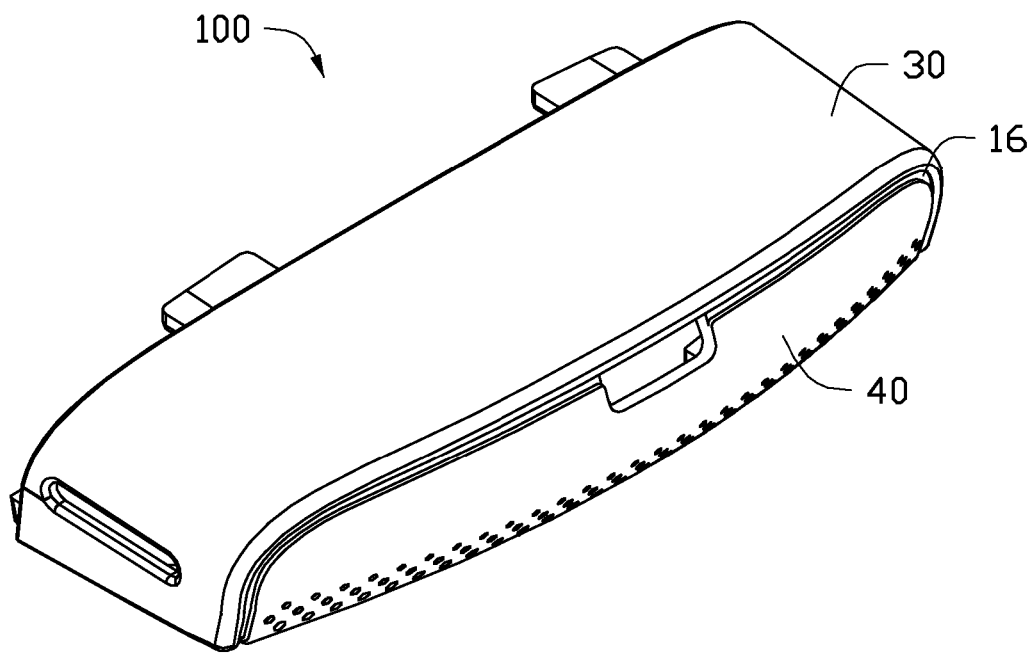
FIG. 1 is an isometric view of an exemplary embodiment of a device housing.
Figure 2:
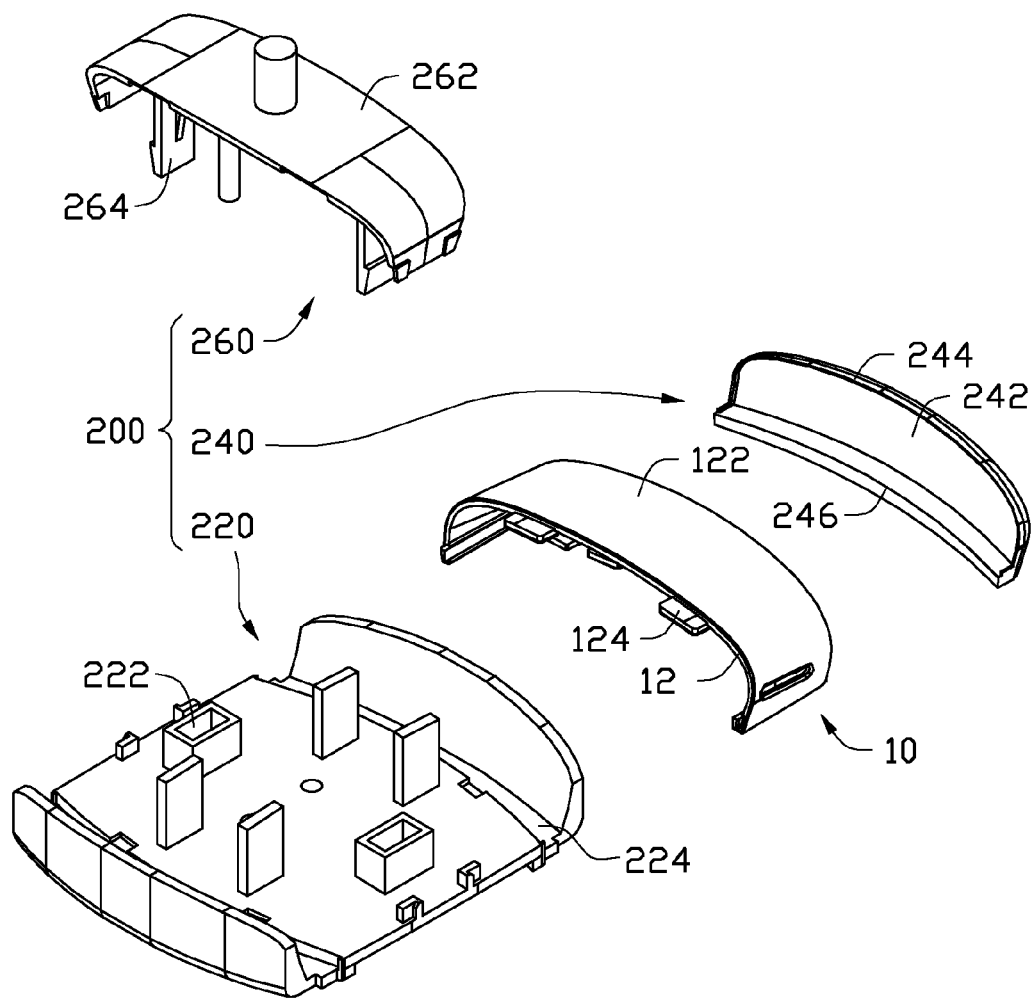
FIG. 2 is an explored view of an exemplary embodiment of a first shielding assembly of an apparatus for making the device housing shown in FIG. 1.
Figure 3:
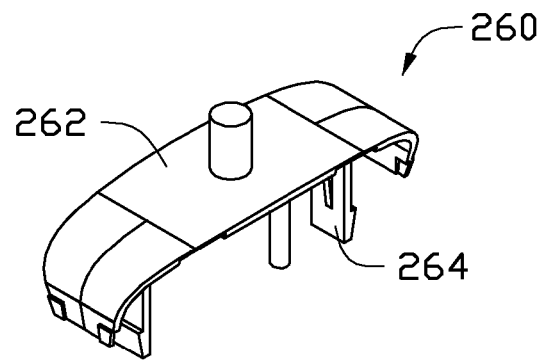
FIG. 3 is another explored view of the first shielding assembly shown in FIG. 2.
Figure 3:
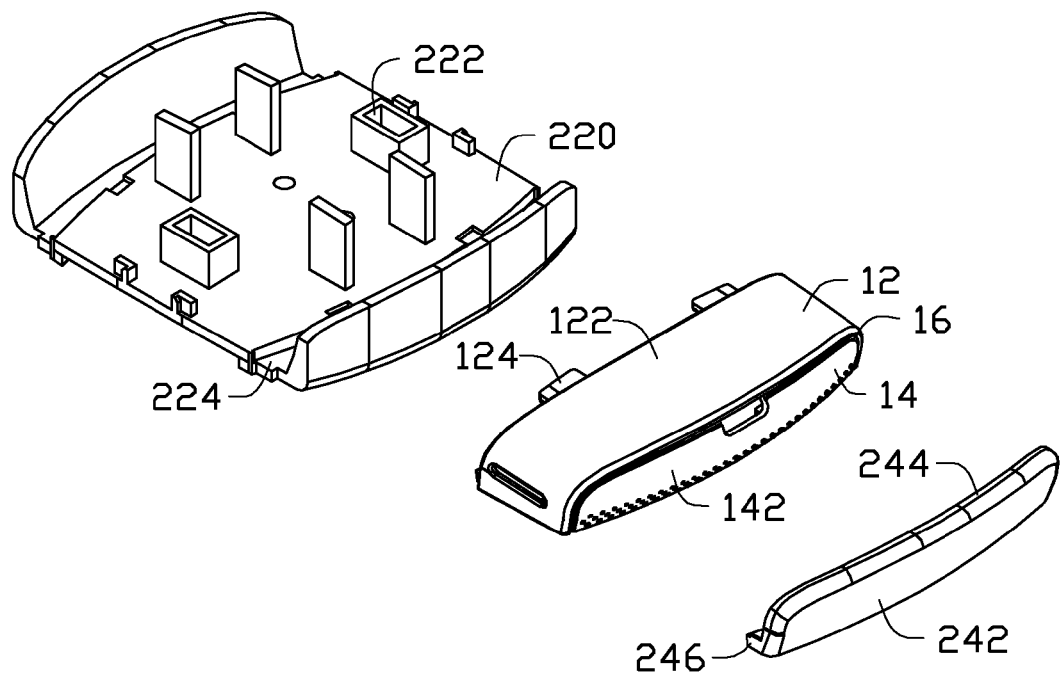

Referring to FIGS. 1-3, a device housing 100 according to an exemplary embodiment includes a main body 10, a metallic layer 30, and a paint layer 40. The device housing 100 may be a housing of an electronic device, such as, a mobile phone, a personal digital assistant, or a computer.

Referring to FIGS. 2 and 3, the main body 10 includes a peripheral wall 12 and a end wall 14 adjacent to the peripheral wall 12. The peripheral wall 12 defines a first surface 122. The end wall 14 defines a second surface 142. The first surface 122 is adjacent to the second surface 142. The metallic layer 30 is formed on the first surface 122 by vacuum deposition. The paint layer 40 is formed on the second surface 142 by spray painting. The metallic layer 30 is made of metal or metal oxide and has a high gloss. The paint layer 40 presents a matte appearance.

The main body 10 further defines a groove 16. The groove 16 is formed between the first surface 122 and the second surface 142 and separates the first surface 122 and the second surface 142. A retaining plate 124 is defined and protrudes from the peripheral wall 12.

Figure 6:
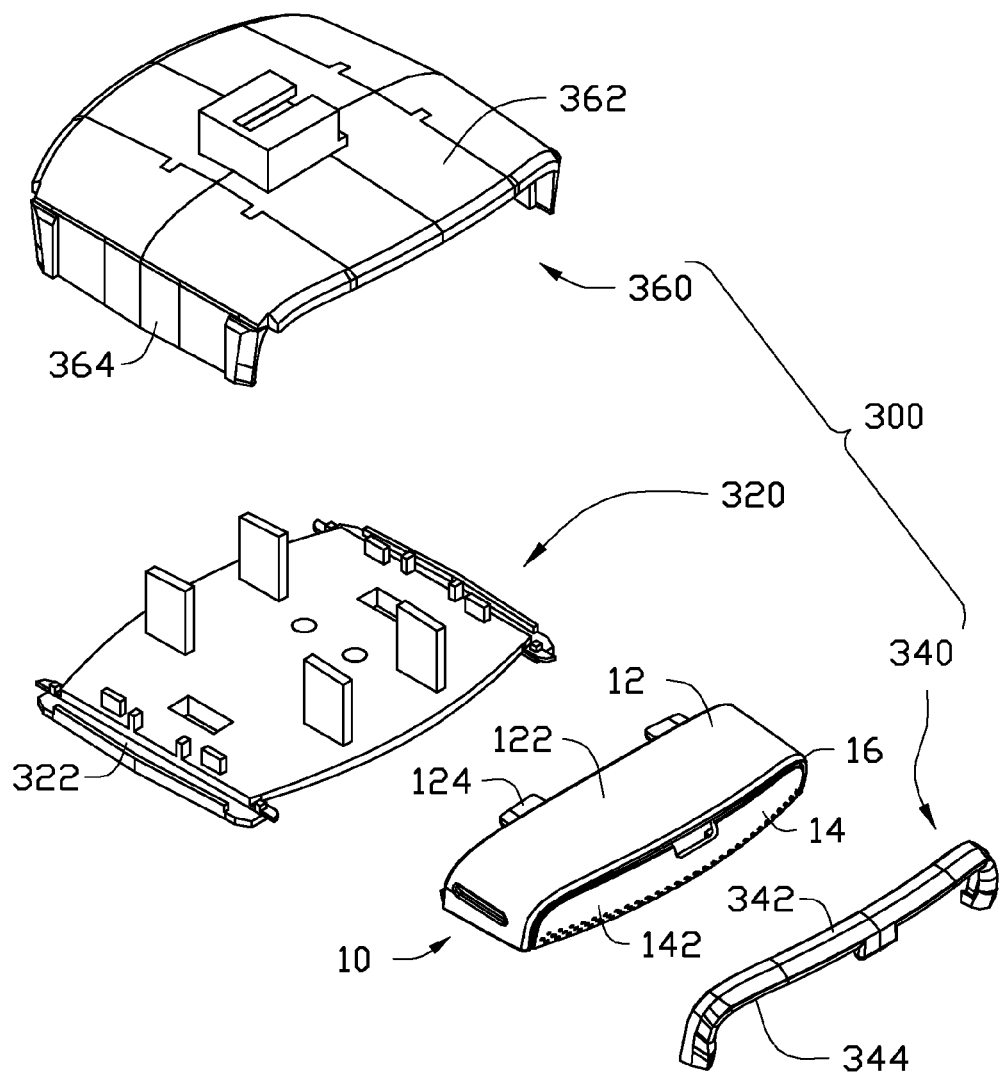
FIG. 6 is an exploded view of an exemplary embodiment of a second shielding assembly of the apparatus for making the device housing shown in FIG. 1.

The device housing 100 is manufactured using an apparatus. Referring to FIGS. 2 and 6, the apparatus includes a first shielding assembly 200 and a second shielding assembly 300.

Referring to FIGS. 2 and 3, the first shielding assembly 200 includes a first base plate 220, a first shielding element 240, and a catching element 260.

The first base plate 220 defines at least one catching hole 222 and at least one first cutout 224. In the embodiment, there are two catching holes 222 and two first cutouts 224. The first shielding element 240 includes a first shielding board 242, a first catching slip 244, and a latching piece 246 opposite to the first catching slip 244. The first catching slip 244 and the latching piece 246 are respectively extending and bent from the two ends of the first shielding board 242. The first catching slip 244 has a size mating with the groove 16. The catching element 260 includes a catching plate 262 and at least one clasp 264 protruding from a surface of the catching plate 262. In the embodiment, there are two clasps 264.

Figure 4:
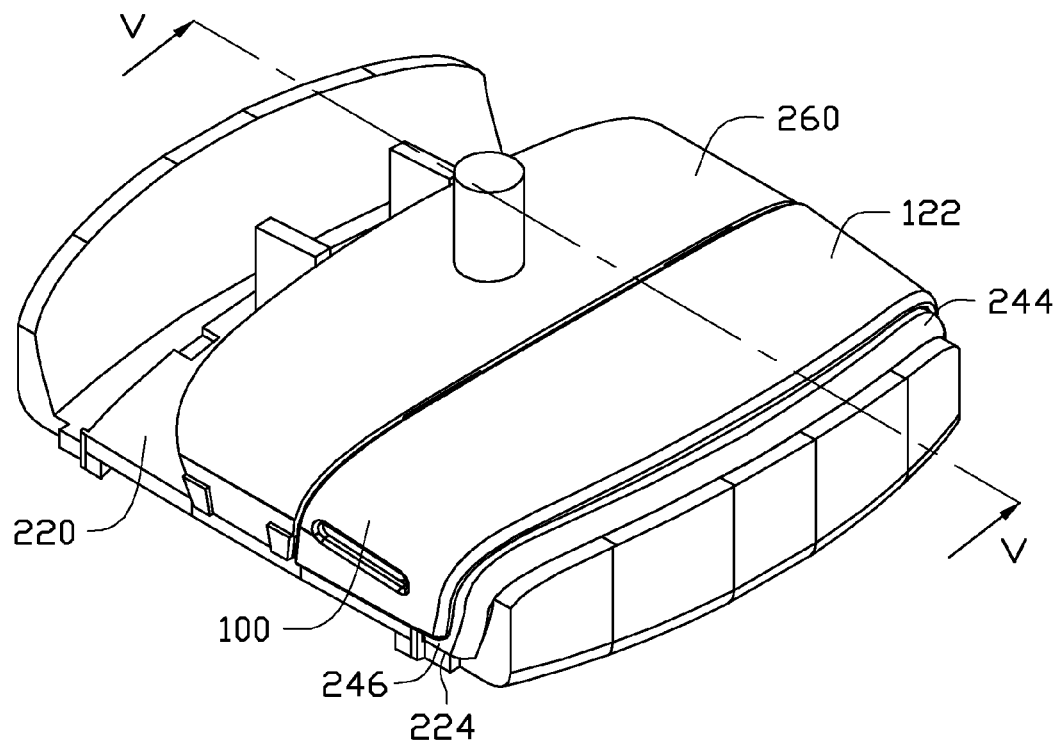
FIG. 4 is an assembly view of the first shielding assembly shown in FIG. 3 configured with the device housing.
Figure 5:
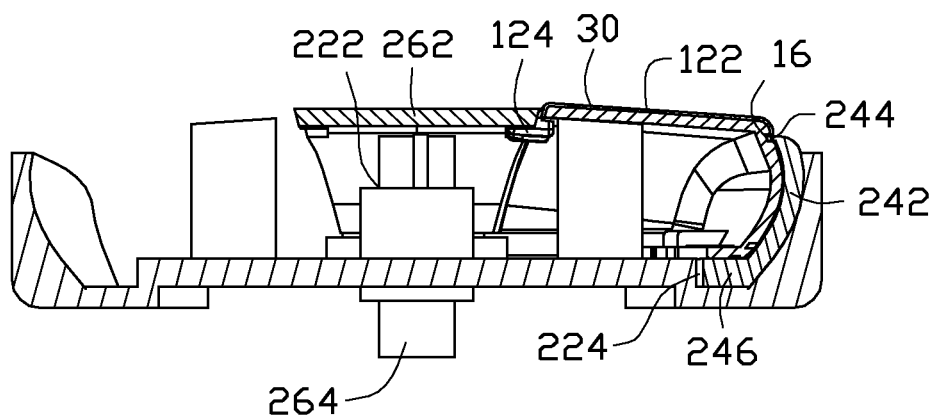
FIG. 5 is a cross-sectional view of the assembly of the first shielding assembly and the device housing shown in FIG. 4 take along line V-V.

Referring to FIGS. 4 and 5, the first catching slip 244 of the first shielding element 240 is caught and engaged in the groove 16 of the main body 10, and the latching piece 246 latches the end of the end wall 14 far away from the groove 16, thereby fastens the first shielding element 240 on the main body 10 and allows the first shielding board 242 to cover and shield the second surface 142 of the main body 10. The latching piece 246 is inserted into the first cutout 224 of the first base plate 220, thereby brings the peripheral wall 12 of the main body 10 to resist against the first base plate 220. The catching plate 262 contacts and presses the retaining plate 124 of the main body 10, the clasp 264 of the catching element 260 is clasped into the catching hole 222 of the first base plate 220, allowing the main body 10 to be fastened on the first base plate 220. At this time, only the first surface 122 of the main body 10 is not shielded by the first shielding assembly 200, which allows the metallic layer 30 to only deposit on the first surface 122.

After the metallic layer 30 is formed on the first surface 122, the first shielding assembly 200 is detached from the main body 10.

Referring to FIG. 6, the second shielding assembly 300 includes a second base plate 320, a second shielding element 340, and a third shielding element 360.

The second base plate 320 defines two second cutouts 322. The second shielding element 340 includes a seal piece 342 and a second catching slip 344 extending and bending from one side of the seal piece 342. The seal piece 342 is for mating with the third shielding element 360 to prevent the paint for forming the paint layer 40 from flowing to the first surface 122. The second catching slip 344 has a size mating with the groove 16. The second catching slip 344 catches and engages in the groove 16. The third shielding element 360 includes a second shielding board 362 and two opposite catching walls 364 extended and bended from the two sides of the second shielding board 362.

Figure 7:
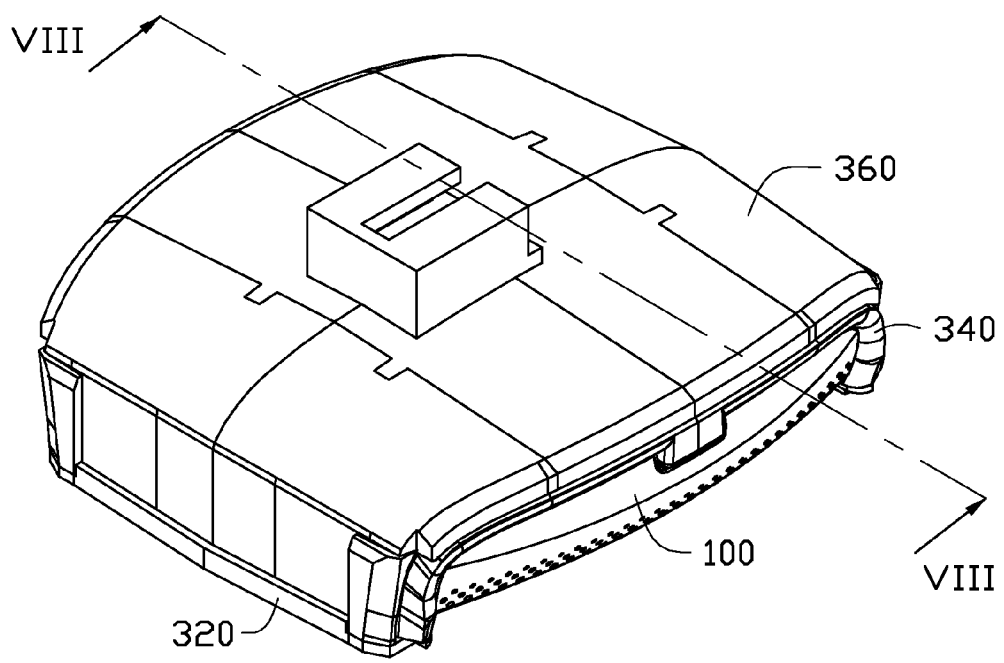
FIG. 7 is an assembly view of the second shielding assembly shown in FIG. 6 configured with the device housing.
Figure 8:
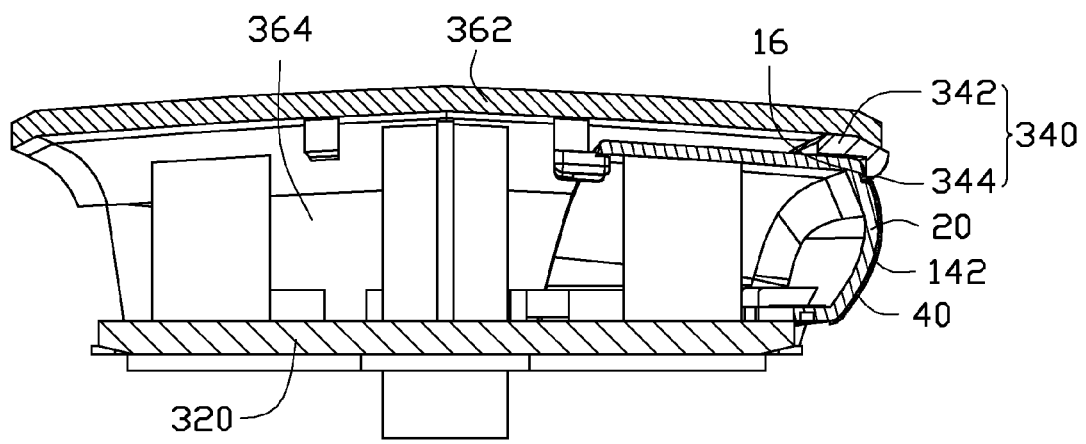
FIG. 8 is a cross-sectional view of the assembly of the second shielding assembly and the device housing shown in FIG. 7 take along line VIII-VIII.

Referring to FIGS. 7 and 8, the second catching slip 344 of the second shielding element 340 catches and engages in the groove 16 of the main body 10. The seal piece 342 resists against the peripheral wall 12 of the main body 10. The main body 10 incorporated with the second shielding element 340 is then positioned on the second base plate 320. The second shielding board 362 of the third shielding element 360 covers the seal piece 342 and the peripheral wall 12 of the main body 10. The seal piece 342 seals the space between the peripheral wall 12 and the third shielding element 360. The catching walls 364 of the third shielding element 360 are then inserted into the second cutouts 322 to fasten the main body 10 on the second base plate 320. At this time, the metallic layer 30 formed on the first surface 122 is shielded by the third shielding element 360, and only the second surface 142 of the main body 10 is exposed to allow the paint layer 40 to be formed on the second surface 142.

After the paint layer 40 is formed on the second surface 142, the second shielding assembly 300 is detached from the main body 10.

The device housing 100 of the exemplary embodiment defines a metallic layer 30 having a high gloss and a paint layer 40 having a matte appearance on different regions of the surface of the main body 10, which provides the device housing 100 an atheistic appearance. Compared to the conventional ink shielding or film shielding process, the apparatus which includes the first shielding assembly 200 and the second shielding assembly 300 for making the device housing 100 can precisely shield the second surface 142 and the first surface 122 of the main body 10. Furthermore, the mating of the groove 16 of the main body 10 with the first catching slip 244 or the second catching slip 344 not only fastens the first shielding element 240 or the second shielding element 340 on the main body 10 but also further improves the shielding effect of the first shielding assembly 200 and the second shielding assembly 300.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. An apparatus used for making a device housing which comprises a main body defining a first surface, a second surface, and a groove formed between the first surface and the second surface, the apparatus comprising:
    a first shielding assembly comprising a first shielding element, a first base plate and a catching element, the catching element catching the main body and fastening the main body on the first base plate, the first base plate defining a catching hole, the catching element comprising a catching plate, the catching plate defining a clasp protruded from a surface of the catching plate, the clasp being clasped in the catching hole to fasten the catching plate and the main body on the first base plate; and
    a second shielding assembly comprising a second shielding element and a third shielding element, the first shielding assembly and the second shielding assembly alternately shielding the second surface and the first surface of the main body;
    the first shielding element comprising:
    a first shielding board covering and shielding the second surface of the main body; and
    a first catching slip extending and bending from one side of the first shielding board, the first catching slip having a size mating with the groove of the main body and catching in the groove to separate the first surface and the second surface;
    the second shielding element comprising a second catching slip catching in the groove to separate the first surface and the second surface; and
    the third shielding element covering and shielding the first surface of the main body.

2. The apparatus as claimed in claim 1, wherein the main body defines a peripheral wall, the peripheral wall defines a retaining plate protruded from one side of the peripheral wall, the catching plate contacts and presses the retaining plate to fasten the main body on the first base plate.

3. The apparatus as claimed in claim 1, wherein the first shielding element further comprises a latching piece extending and bending from another side of the first shielding board, the first base plate defines a first cutout therein, the latching piece latches the main body and inserts into the first cutout.

4. The apparatus as claimed in claim 1, wherein the second shielding assembly further comprises a second base plate defining two second cutouts, the third shielding element comprises a second shielding board, the second shielding board defines two opposite catching walls extended and bended from the two sides of the second shielding board, the second shielding board and the catching walls cover the main body, and the catching walls insert into the second cutouts to fasten the main body on the second base plate.

5. The apparatus as claimed in claim 4, wherein the second shielding element further comprises a seal piece resisting against the main body, the second catching slip is extended and bended from one side of the seal piece.

6. The apparatus as claimed in claim 5, wherein the second shielding board of the third shielding element covers the seal piece and the main body, the seal piece seals the space between the main body and the third shielding element.

* * * * *